(12) United States Patent
Vanderhoof et al.

(10) Patent No.: US 6,800,114 B2
(45) Date of Patent: Oct. 5, 2004

(54) PRESSURE EQUALIZATION APPARATUS AND METHODS

(75) Inventors: Troy Inslee Vanderhoof, Plano, TX (US); Brian Douglas Cross, Double Oak, TX (US); John Michael Curry, Plano, TX (US); Gordon L. Treichler, Wylie, TX (US)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/213,640

(22) Filed: Aug. 7, 2002

(65) Prior Publication Data

US 2004/0025691 A1 Feb. 12, 2004

(51) Int. Cl.$^7$ ................................................. B01D 53/04
(52) U.S. Cl. ....................... 95/117; 96/108; 55/385.4; 333/248
(58) Field of Search .............. 55/385.4, 385.6; 96/108, 147, 148; 95/90, 117, 902; 333/99 R, 248; 206/0.7

(56) References Cited

U.S. PATENT DOCUMENTS

| | | | |
|---|---|---|---|
| 1,131,712 A | 3/1915 | Klein | |
| 2,273,505 A | 2/1942 | Florian | 138/28 |
| 3,315,447 A | 4/1967 | Meier | 55/384 |
| 3,612,344 A | 10/1971 | Stuart | 220/85 |
| 3,710,553 A | 1/1973 | Parker et al. | 55/316 |
| 3,734,296 A | 5/1973 | Proctor et al. | 210/288 |
| 3,735,563 A | 5/1973 | Adams | 55/179 |
| 3,850,592 A | 11/1974 | Huffman | 55/33 |
| 3,932,944 A | 1/1976 | Chiba | 34/12 |
| 3,999,235 A | 12/1976 | Mollura | 5/370 |
| 4,065,894 A * | 1/1978 | Day | 52/171.3 |
| 4,279,363 A | 7/1981 | Alikhan | 222/94 |
| 4,376,489 A | 3/1983 | Clemens | 220/1.5 |
| 4,453,955 A | 6/1984 | Cullen et al. | 55/387 |
| 4,460,102 A | 7/1984 | Barringer | 220/85 |
| 4,474,215 A | 10/1984 | Richter et al. | 138/30 |
| 4,552,228 A | 11/1985 | Evans et al. | 175/228 |
| 4,616,620 A * | 10/1986 | Paoluccio | 123/573 |
| 4,633,845 A | 1/1987 | Seleno | 123/568 |
| 4,661,128 A | 4/1987 | Bachhofer et al. | 55/208 |
| 4,694,267 A | 9/1987 | Guill et al. | 333/248 |
| 4,729,339 A | 3/1988 | Whiting | 116/268 |
| 4,771,320 A | 9/1988 | Gell | 354/64 |
| 4,827,719 A * | 5/1989 | Paoluccio | 60/478 |
| 4,836,241 A | 6/1989 | Schoenwald | 137/494 |
| 4,890,764 A | 1/1990 | Rossini | 220/460 |
| 5,399,855 A | 3/1995 | Rouleau et al. | 260/239 |
| 5,434,748 A | 7/1995 | Fukui et al. | 361/757 |
| 5,497,290 A | 3/1996 | Fukui et al. | 361/752 |
| 5,505,768 A * | 4/1996 | Altadonna | 96/108 |
| 5,526,526 A | 6/1996 | Clark et al. | 455/90 |
| 5,902,381 A * | 5/1999 | Golner et al. | 96/146 |
| 5,950,631 A | 9/1999 | Donaldson et al. | 128/898 |
| 6,024,775 A * | 2/2000 | Miller et al. | 55/385.1 |
| 6,064,287 A | 5/2000 | Jones | 333/248 |
| 6,297,448 B1 | 10/2001 | Hara | 174/52.3 |

FOREIGN PATENT DOCUMENTS

| | | |
|---|---|---|
| JP | 57032102 | 2/1982 |
| JP | 62157662 | 7/1987 |
| JP | 01220902 | 9/1989 |
| JP | 07042452 | 2/1995 |

* cited by examiner

*Primary Examiner*—Frank M. Lawrence
(74) *Attorney, Agent, or Firm*—Wood, Herron & Evans, L.L.P.

(57) ABSTRACT

A pressure equalization apparatus for decreasing or eliminating the pressure differential between the internal pressure within a sealed system and the external ambient air pressure while concurrently sustaining a dry atmosphere inside the enclosure. The apparatus includes a variable volume chamber coupled in fluid communication with the sealed system and adapted to change its volume as in relation to the pressurization of the sealed system. Gas flowing between the sealed system and the variable volume chamber, as the pressurization changes, is exposed to an adsorbent operative for dehumidifying the exchanged gas.

45 Claims, 4 Drawing Sheets

PRESSURE EQUALIZATION APPARATUS AND METHODS

FIELD OF THE INVENTION

This invention relates generally to sealed systems and, in particular, to apparatus and methods for equalizing the pressure within sealed systems.

BACKGROUND OF THE INVENTION

A non-pressurized, fixed-volume sealed system or enclosure may be hermetically sealed to isolate the enclosed air space from contaminants, such as water vapor, in the surrounding ambient atmosphere. Certain of these sealed systems are exposed to temperature variations arising due to the transfer of heat to and from housed components or an external source. The temperature variations modulate the pressure of the air, or other gas, filling the hermetically-sealed enclosure. In particular, sealed systems exposed to the daily heating and cooling of an outdoor environment experience cyclic pressurization and depressurization due to volume changes in the enclosed gas. Specifically, absorption of solar radiation by the material forming the sealed system transfers significant amounts of heat energy to the gas inside the sealed system, which can attain a temperature significantly higher than the ambient temperature surrounding the sealed system. Generally, the pressure variation within a sealed system at most practical temperatures of interest is about 1.5 p.s.i. per each 60° F. temperature increment.

Communications systems incorporate non-pressurized, sealed systems, such as waveguides and transmission lines, that enclose fixed volume air spaces. Such sealed systems typically feature RF-transmissive windows susceptible to mechanical damage or failure if the enclosed gas, when heated, exerts an excessive positive or outwardly-directed pressure. Alternatively, the external air pressure may exert an inwardly-directed pressure when the enclosed gas is cooled that is sufficient to cause the RF-transmissive window to be damaged or to implode. In addition, such sealed systems may incorporate multiple sections united by sealed junctions relying on conventional sealing members such as compressed elastomeric o-rings or gaskets. During a heating period, the enclosed gas becomes pressurized and exerts an outwardly-directed force at each sealed junction. The outwardly-directed force can compromise the ability of the sealing member to provide an effective seal so that gas may breach the sealed junction and escape from the sealed system to compensate for the increased pressure. As the sealed system cools after the heating period, the decreasing pressure of the gas can aspirate air from the ambient atmosphere past the seals and into the sealed system. The aspirated ambient air entering the sealed system can be laden with water vapor or other contaminants.

Other types of sealed systems are enclosures incorporate an access opening covered by a reclosable closure. The access opening is dimensioned to permit manual entry, when the closure is removed, into the interior space of the hermetically-sealed enclosure. A sealing member is typically compressively captured between the outer periphery of the closure and the inner periphery of the access opening to provide an air-impermeable seal. During a heating period, the closure experiences an outwardly-directed motive force proportional to the exposed area of the closure as the pressure inside the hermetically-sealed enclosure increases. The outwardly-directed force reduces the effectiveness of the seal so that the enclosed air escapes past the sealing member to compensate for the increased pressure. Closures on larger hermetically-sealed enclosures generally have a larger surface area upon which the outwardly-directed pressure can act and, therefore, will experience greater outward net forces during the heating phases of the cycle so that the detrimental effect of the thermal cycling is amplified. As the hermetically-sealed enclosure cools after the heating period, the decrease in the internal pressure can aspirate air laden with water molecules from the ambient atmosphere past the sealing member and into the enclosure.

The water vapor in the ambient air admitted into the sealed system or enclosure condenses as water on the moisture-sensitive surfaces and any electrical components inside the enclosure, with deleterious effects. In transmission lines and waveguides used in communications systems, condensate causes corrosion and oxidation that increase attenuation and that can permanently or intermittently degrade the system performance. Another effect is that condensate can create a conductive pathway between the inner and outer conductors of transmission lines that can lead to voltage arcing and subsequent failure. For electrical components, the condensate corrodes and oxidizes electrical contacts. Therefore, an important design consideration for sealed systems is to prevent condensation at the lowest potential temperature to which the sealed system is cooled.

Two conventional approaches have been used to provide pressure equalization in sealed systems having non-pressurized air spaces that require a dry environment. One approach is to provide a sidewall of the sealed system with an expandible diaphragm. As the pressure within the sealed system increases and decreases as a function of temperature, the diaphragm expands and contracts to adjust the total volume of the sealed system for maintaining a constant internal pressure. However, when the sealed system is hermetically sealed, the environment inside the system will reflect the atmosphere in which the system was sealed. Unless measures are taken to provide a dry gaseous environment with a suitable dew point, the relatively humid air trapped inside the sealed system during the sealing process will contain significant moisture. The moisture provides a readily available source of condensate. In addition, each time the sealed system is opened in an ambient environment, relatively humid air will fill the system unless suitable precautions are taken when the system is resealed. Moreover, inwardly-directed leakage from the ambient environment due to imperfect sealing can introduce humid air from the ambient environment.

Another approach is to vent the sealed system to the ambient atmosphere through a fluid passageway that includes a static desiccant. The desiccant removes moisture from the ambient air entering the sealed system as the pressure inside drops. Typically, the desired dew point inside the sealed system is less than about −40° C. to about −45° C. which corresponds to about 0.2% relative humidity. However, desiccants in such pressure equalization apparatus become saturated with moisture and must either be intermittently regenerated or replaced. In addition, if the sealed system is opened and resealed, it takes many air exchanges during heating cycles to effectively lower the humidity back to the desired level.

Often, sealed systems are found in positions that are not readily accessible so that the absorbent or desiccant cannot be easily serviced when saturated. For example, desiccated vents for tower-mounted sealed systems can only be serviced if a technician climbs to the top of the tower or uses a crane or a lift to gain access. In addition, any operating equipment near the sealed system must be idled while the technician services the desiccated vent for safety reasons, which disrupts service and increases maintenance costs.

Therefore, it would be desirable to have an apparatus and associated methods for regulating the internal pressure of a gas within a sealed system while maintaining the gas at a characteristic dew point and that can do so while lengthening the lifetime of the adsorbent dehumidifying the gas to provide the characteristic dew point.

DETAILED DESCRIPTION OF THE INVENTION

Although the invention will be described next in connection with certain preferred embodiments, it will be understood that the invention is not limited to those particular embodiments. On the contrary, the description of the invention is intended to cover all alternatives, modifications, and equivalent arrangements as may be included within the spirit and scope of the invention as defined by the appended claims.

The invention provides apparatus and methods for maintaining a gas, such as air, within a sealed system at a desired pressure and at a desired moisture level, dew point or relative humidity as the temperature of the sealed system varies. More particularly, the invention provides desiccator-based apparatus and methods for use with any sealed system that experiences significant temperature variations or swings due to changes in the pressure of the gas within the sealed system caused by, for example, heat transferred by the ambient environment or heat originating from components housed in the sealed space. Such sealed systems include, but are not limited to, hermetically-sealed enclosures and cables, conduits, waveguides, plenums or other sealed air spaces in communications systems. The invention overcomes the deleterious effects, if otherwise uncompensated, of pressure variations that tend to compromise the integrity of fluid seals integrated into the sealed system.

According to the principles of the invention, a fixed volume air space within the sealed system is maintained at a substantially constant pressure near atmospheric pressure by coupling a variable volume chamber in fluid communication with the fixed volume space. As the pressure of the gas within sealed system varies, the volume of the variable volume chamber increases so that the composite pressure inside the variable volume chamber and the sealed system remains substantially constant. As a result, any pressure differential between the sealed system and the ambient atmosphere is eliminated or rendered otherwise insignificant.

According to another aspect of the invention, gas exchanged between the fixed volume space of the sealed system and the variable volume chamber must permeate an adsorbent housed in a desiccating vessel so that the gas inside the sealed system is maintained at a relatively low dew point in comparison with the ambient dew point. The lifetime of the adsorbent is significantly extended because gas is not being exchanged between the fixed volume space of the sealed system and the ambient environment. In addition, the pressure equalization apparatus of the invention hastens the return of the sealed system to a suitably dry atmosphere if the sealed system is unsealed so that gas from the ambient atmosphere can enter and then resealed.

Figure 1:
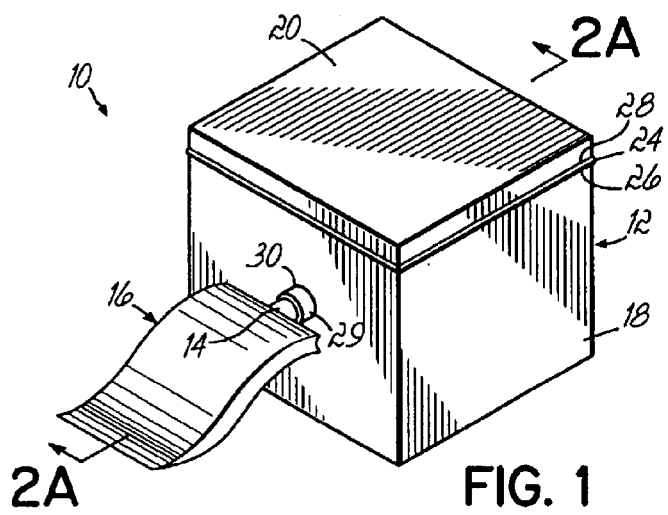
FIG. 1 is a perspective view of a sealed system incorporating a pressure equalization apparatus in accordance with aspects of the invention.
Figure 2A:
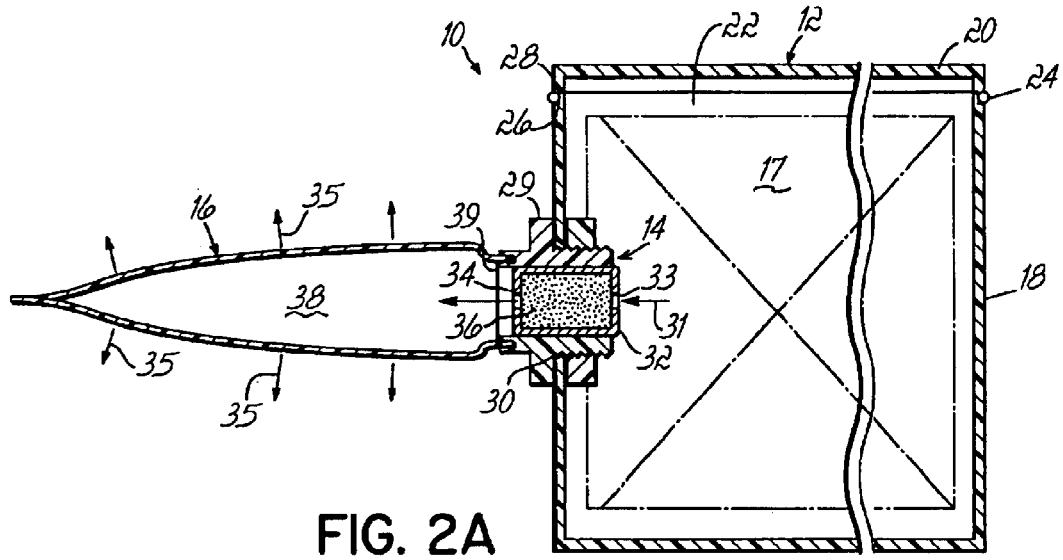
FIGS. 2A and 2B are sectional views taken generally along line 2A—2A of FIG. 1.
Figure 2B:
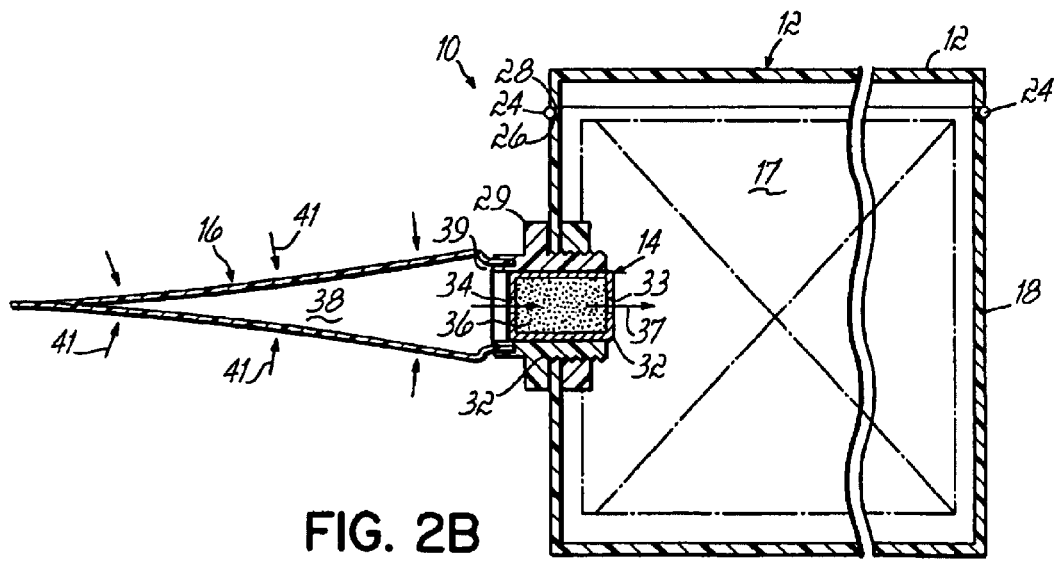

With reference to FIGS. 1, 2A and 2B, a pressure equalization apparatus 10 in accordance with an embodiment of the invention for a sealed system, such as enclosure 12, includes a desiccating vessel 14 and a variable volume chamber 16. The enclosure 12 surrounds a fixed volume space 17 and includes a base 18 and a closure 20 that covers an access opening 22. Removal of the closure 20 affords access into the fixed volume space 17 through the access opening 22. A sealing element 24 is compressively captured between a sealing surface 26 of the base 18 and a complementary sealing surface 28 of the closure 20. The compressive engagement of sealing element 24 between the sealing surfaces 26, 28 provides a hermetic or air tight seal that prevents the entry of contaminants, such as water vapor, from the surrounding ambient environment into the fixed volume space 17. A port 30 is provided in the base 18 and presents a flow passageway for establishing fluid communication with the fixed volume space 17. Additional sealed ports (not shown) may be provided for electrical feedthroughs and the like so that the components inside the enclosure 12 can communicate with external devices.

The desiccating vessel 14 includes a cannister or outer housing 32 having an air inlet 33 in fluid communication the fixed volume space 17 inside the enclosure via port 30 and an air outlet 34. It is appreciated that the air inlet 33 and the air outlet 34 each permit bi-directional fluid flow. The outer housing 32 encloses a quantity of an adsorbent 36 packaged such that multiple air flow paths are present between the air inlet 33 and the air outlet 34. The portion of the outer housing 32 surrounding the air inlet 33 cooperates with a conventional bulkhead fitting 29 to provide a sealing engagement with a confronting portion of the enclosure 12 to prevent fluid exchange with the ambient environment.

The adsorbent 36 inside the desiccating vessel 14 is any material exhibiting a strong adsorption preference for water, thereby providing the capability for separating water from the stream of air or other gas cyclically exchanged between the variable volume chamber 16 and the fixed volume space 17 inside the enclosure 12. The adsorbent 36 preferably has a high selectivity for water and is capable of attractively holding the separated water without substantial re-release until the adsorbent 36 is saturated.

Suitable conventional hygroscopic materials, typically provided as granules but not so limited, for use as adsorbent 36 include, but are not limited to, activated alumina-based adsorbents, anhydrous calcium sulfate, silica gels, zeolite molecular sieves, and non-zeolite molecular sieves. These various adsorbents may be used either individually or in appropriate combinations of two or more types. Various molecular sieve adsorbents and silica gels suitable for use in the invention are commercially available, for example, from the Davison Chemicals Division of W. R. Grace & Co. (Columbia, Md.). Alumina-based adsorbents suitable for use in the invention are commercially available from, for example, the Alcoa Adsorbents & Catalysts Division of Alcoa World Chemicals (Leetsdale, Pa.). Calcium sulfate adsorbents suitable for use in the invention are commercially available, for example, under the DRIERITE® tradename from W. A. Hammond Drierite Co. Ltd. (Xenia, Ohio).

An appropriate quantity of adsorbent 36 is associated with the enclosure 12 according to the capacity of the fixed volume space 17 and according to an expected or estimated frequency at which the closure 20 is unsealed to afford access through the access opening 22 into the fixed volume space 17. Every time that the closure 20 is removed, humid ambient air from the surrounding environment fills the fixed volume space 17. Generally, most adsorbents 36 are rated at about 25 cubic feet of drying capacity per every 4 ounces of adsorbent. For example, a fixed volume space of 1 cubic foot serviced by 4 ounces of adsorbent 36 could be filled by humid ambient air about 25 times before the adsorbent 36 would require replacement or regeneration.

With reference to FIGS. 1, 2A and 2B, the air outlet 34 of the desiccating vessel 14 is placed in communication with a variable volume space 38 enclosed within the variable volume chamber 16. The desiccating vessel 14 and the variable volume chamber 16 are coupled with a conventional hermetically sealed engagement as understood by a person of ordinary skill in the art. The portion of the outer housing 32 surrounding the air outlet 34 has a sealing engagement with an inlet 39 of the variable volume chamber 16 so that air cannot enter from the ambient environment. It is appreciated that the variable volume chamber 16 may be sealed directly to the exterior of the enclosure 12 such that the desiccating vessel 14 does not participate in the sealing engagement therebetween.

The variable volume chamber 16 is a bladder fabricated from any flexible material that is impermeable to the diffusion of moisture and that presents a minimal resistance to elastic expansion. Such materials include, but are not limited to, Mylar and butyl rubber. The material forming the variable volume chamber 16 should also be stable when immersed in an uncontrolled environment having a temperature range characteristic of an outdoor environment and should resist cracking and remain reasonably flexible at the lowest temperatures typically expected in an outdoor environment. It is appreciated that movable seal structures other than bladders to accommodate the change in volume can also be used, such as bellows, diaphragms or floating pistons, as will be described below.

The capacity of the variable volume space 38 is related to the capacity of the fixed volume space 17 and to the projected heat load of the enclosure 12. Generally, the capacity of the variable volume space 38 is dimensioned to minimize the space occupied by the footprint of the variable volume chamber 16. To that end, the volume of the variable volume space 38 in its fully expanded state can be calculated and the variable volume chamber 16 dimensioned accordingly. For example, an enclosure having a heat load sufficient to produce a temperature variation of the gas within the fixed volume space of 70° F. produces a 10 percent increase in gas volume at the highest temperature for a constant pressure so that, for example, a 0.1 cubic foot variable volume space in the fully expanded state is needed to adequately pressure compensate a 1 cubic foot fixed volume space. It is appreciated that the capacity of the variable volume chamber 16 may be customized at the point of use by constructing chamber 16 from a suitable thermoplastic polymer resin and using a heat sealing device to create a barrier seal to isolate a portion of the variable volume space 38 to provide the required capacity in the fully expanded state.

In use, the pressure equalization apparatus 10 and enclosure 12 are positioned in an environment in which the temperature of the gas inside the fixed volume space 17 varies between a relatively low temperature and a relatively high temperature. For example, the pressure equalization apparatus 10 and enclosure 12 may be positioned in an outdoor environment so that the source of the heat producing the temperature changes is solar and the heating/cooling cycle is intermittent. When the temperature of the gas is rising, gas is transferred at a low flow rate, as represented by arrow 31 in FIG. 2A, from the fixed volume space 17 of the enclosure 12 through the desiccating vessel 14 to the variable volume space 38 enclosed by the variable volume chamber 16. The variable volume chamber 16 expands, as represented by arrows 35 in FIG. 2A, in response to receiving the additional volume of gas so that the pressure in the fixed volume space 17 remains substantially constant. As a result, the pressure differential between the fixed volume space 17 and the surrounding ambient environment is negligible so that no outwardly directed force is applied to the closure 20 and the sealing element 24 remains compressively captured between the sealing surfaces 26, 28 so that no outward flow of gas from the fixed volume space 17 can occur. When the temperature of the gas is falling, gas is transferred at a low flow rate, as represented by arrow 37 in FIG. 2B, from the variable volume space 38 though the desiccating vessel 14 to the fixed volume space 17. The variable volume chamber 16 contracts, as represented by arrows 41 in FIG. 2B, in response to exhausting gas so that the pressure in the fixed volume space 17 remains substantially constant.

The gas flowing through the desiccating vessel 14 during periods of heating and cooling will be exposed to the adsorbent 36 and will be incrementally dehumidified to provide a desired dew point or relative humidity inside enclosure 12. It is appreciated that the present invention is not so limited to providing a dew point within enclosure 12 in this range. After the desired dew point is achieved, the moisture level of the gas is reduced to a threshold limit characteristic of the properties of the adsorbent 36. Accordingly, additional gas exchanges through the desiccating vessel 14 do not remove additional water molecules. However, additional gas exchanges would operate to remove water molecules introduced by leaks in the enclosure 12 or variable volume chamber 16. It is appreciated that the dehumidification provided by the adsorbent 36 will be reinitiated each time the fixed volume space 17 is filled by relatively humid gas or air from the surrounding environment as the closure 20 is removed from the access opening 22 and resealed.

According to the principles of the present invention, the pressure equalization apparatus 10 maintains the pressure of the gas inside the fixed volume space 17 substantially equal to the air pressure of the ambient environment surrounding the enclosure 12 and the variable volume chamber 16. As a result, the net force acting on the closure 20 is negligible, nil or otherwise balanced so that gas cannot leak outwardly past sealing element 24 as the temperature of the gas inside enclosure 12 increases nor can humid air leak inwardly past sealing element 24 as the temperature of the gas inside enclosure 12 decreases. In addition, the adsorbent 36 inside the desiccating vessel 14 reduces the dew point or relative humidity of the gas inside enclosure 12 by selectively removing water molecules or moisture from the gas intermittently or cyclically transferred between spaces 17 and 38.

Figure 3:
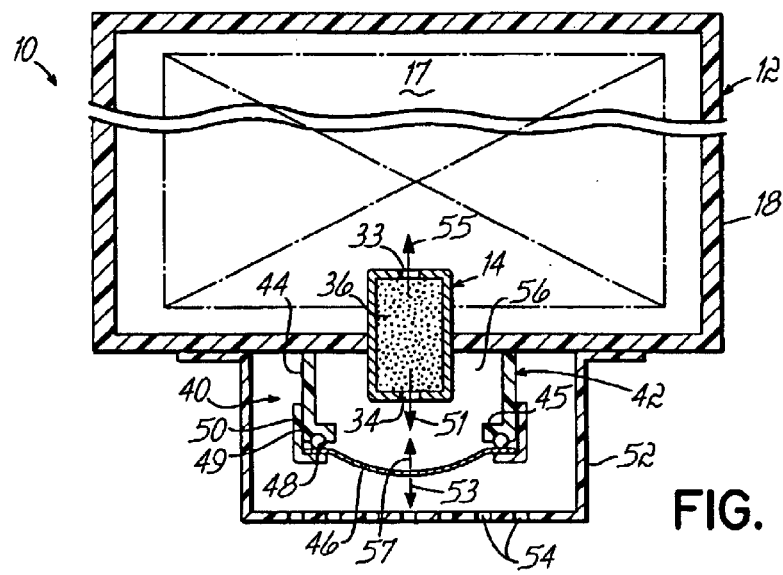
FIG. 3 is top sectional view of another embodiment of a pressure equalization apparatus in accordance with principles of the invention coupled with a sealed system.

With reference to FIG. 3 in which like reference numerals refer to like features in FIGS. 1, 2A and 2B, a pressure equalization apparatus 40 in accordance with another embodiment of the invention includes a variable volume chamber 42 coupled in fluid communication with the enclosure 12 by desiccating vessel 14. The variable volume chamber 42 consists of a cylindrical sleeve 44 attached to and extending outwardly from an exterior side wall of the enclosure 12 and a disk-shaped diaphragm 46 that closes an open end of the sleeve 44. An annular flange 45 extends radially inward from the open end of the sleeve 44. An outer periphery of the diaphragm 46 includes an integral O-ring or sealing bead 48 that participates in forming a hermetic or airtight seal with the flange 45. Specifically, the sealing bead 48 is captured in a circumferential groove 49 extending about flange 45 and compressed against the flange 45 by a circumferential clamp ring 50. The air outlet 34 of the desiccant vessel 14 is coupled in fluid communication with a variable volume space 56 defined within the variable volume chamber 42. The diaphragm 46 is formed by a conventional process from any elastomeric material, including but not limited to natural rubber, synthetic elastomers and fabric-reinforced synthetic elastomers.

A protective cover 52 surrounds the pressure equalization apparatus 40 and includes multiple perforations 54 that permit air flow from the ambient environment into the space between cover 52 and the exterior of the variable volume chamber 42. Cover 52 protects the variable volume chamber 42 from damage due to environmental contaminants such as ultraviolet radiation and ozone and from animal attack.

In use, the variable volume space 56 receives gas from the fixed volume space 17, as represented by arrow 51 in FIG. 3, when the temperature of the gas confined inside the fixed volume space 17 is increasing. The transferred gas received by the variable volume space 56 provides a displacement force that distends diaphragm 46 in an outward direction, as represented by arrow 53 in FIG. 3. Conversely, when the temperature of the gas confined inside the fixed volume space 17 is decreasing, gas is transferred from the variable volume space 56 and received by the fixed volume space 17, as represented by arrow 55 in FIG. 3. A displacement force applied by the air pressure of the ambient environment surrounding the variable volume chamber 42 causes diaphragm 46 to distend inwardly, as represented by arrow 57 in FIG. 3. If the temperature of the enclosure 12 is constant, the pressure inside the spaces 17 and 38 is equilibrated with the ambient pressure. As a result, gas is not transferred between spaces 17 and 38 and no net displacement force is applied to the diaphragm 46.

According to the principles of the present invention, the pressure equalization apparatus 40 maintains the pressure of the gas inside the fixed volume space 17 substantially equal to the air pressure of the ambient environment surrounding the enclosure 12 and the variable volume chamber 42. As a result, the net force acting on the closure 20 is negligible, nil or otherwise balanced so that gas cannot leak outwardly past sealing element 24 as the temperature of the gas inside enclosure 12 increases nor can humid air leak inwardly past sealing element 24 as the temperature of the gas inside enclosure 12 decreases. In addition, the adsorbent 36 inside the desiccating vessel 14 reduces the dew point or relative humidity of the gas inside enclosure 12 by selectively removing water molecules or moisture from the gas intermittently or cyclically transferred between spaces 17 and 56.

Figure 4:
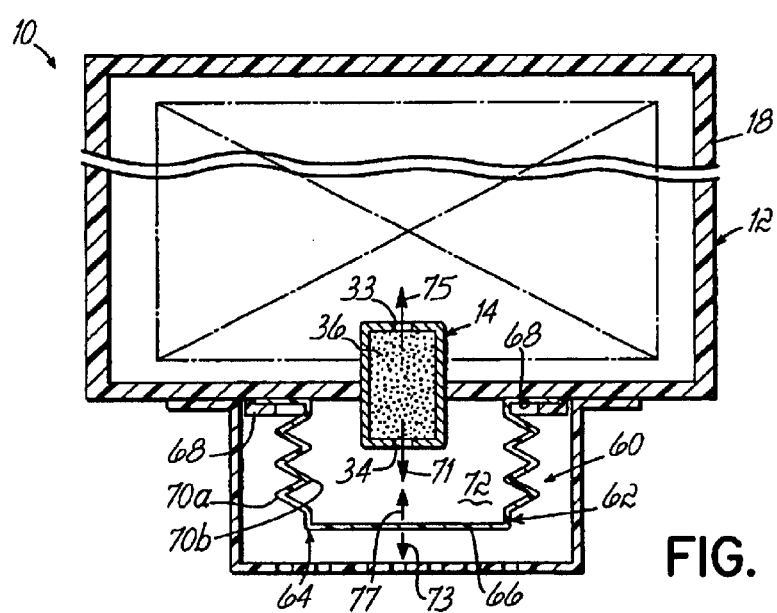
FIG. 4 is a top sectional view of another embodiment of a pressure equalization apparatus in accordance with principles of the invention coupled with a sealed system.

With reference to FIG. 4 in which like reference numerals refer to like features in FIGS. 1, 2A and 2B, another embodiment of a pressure equalization apparatus 60 in accordance with an embodiment of the invention includes a variable volume chamber 62 coupled in fluid communication with the enclosure 12 by desiccating vessel 14. The variable volume chamber 62 consists of a bellows-type side wall 64, a disk-shaped planar end wall 66 closing one end of the side wall 64, and an annular flange 68 at an opposite end of the side wall 64. The bellows-type side wall 64 includes multiple convolutions defined by ridge-like folds 70a and valley-like folds 70b formed in an alternating and continuous manner between the end wall 66 and flange 68. The annular flange 68 extends radially outwardly from the side wall 64 and has a conventional airtight sealed engagement with the side wall 64. The air outlet 34 of the desiccant vessel 14 is coupled in fluid communication with a variable volume space 72 defined within the variable volume chamber 62.

In use, gas is transferred from the fixed volume space 17 through the desiccating vessel 14 to the variable volume space 72 when the gas temperature is increasing, as represented by arrow 71 in FIG. 4. The side wall 64 extends in an outward direction, as represented by arrow 73 in FIG. 4, to increase the volume of the variable volume space 72 for dissipating any additional pressure arising from the inflowing gas from fixed volume space 17. To that end, it is appreciated that the inflowing gas applies an outwardly-directed force primarily to the end wall 66 that is proportional to the amount of transferred gas. The extension of the side wall 64 increases the spaces or gaps between adjacent ones of the folds 70a and folds 70b.

When the temperature of the gas in the fixed volume space 17 is decreasing, gas is transferred from the variable volume space 72 through the desiccating vessel 14 to the fixed volume space 17, as represented by arrow 75 in FIG. 4. The side wall 64 of the variable volume chamber 42 contacts in an inward direction, as represented by arrow 77 in FIG. 4, as gas is exhausted from variable volume space 72. The contraction of the side wall 64 decreases the spaces or gaps between adjacent ones of the folds 70a and folds 70b. If the temperature of the enclosure 12 is constant, the pressure of the gas inside spaces 17 and 72 is equilibrated with the ambient pressure. As a result, gas is not transferred between the spaces 17 and 72 and no net displacement force is applied to end wall 66 that would otherwise cause either extension or retraction of the side wall 64.

According to the principles of the present invention, the pressure equalization apparatus 60 maintains the pressure of the gas inside the fixed volume space 17 substantially equal to the air pressure of the ambient environment surrounding the enclosure 12 and the variable volume chamber 62. As a result, the net force applied to the closure 20 is negligible, nil or otherwise balanced so that gas cannot leak outwardly past sealing element 24 as the temperature of the gas inside enclosure 12 increases nor can humid air leak inwardly past sealing element 24 as the temperature of the gas inside enclosure 12 decreases. In addition, the adsorbent 36 inside the desiccating vessel 14 reduces the dew point of the gas inside enclosure 12 because of the intermittent transfers of gas between the spaces 17 and 72.

Figure 5:
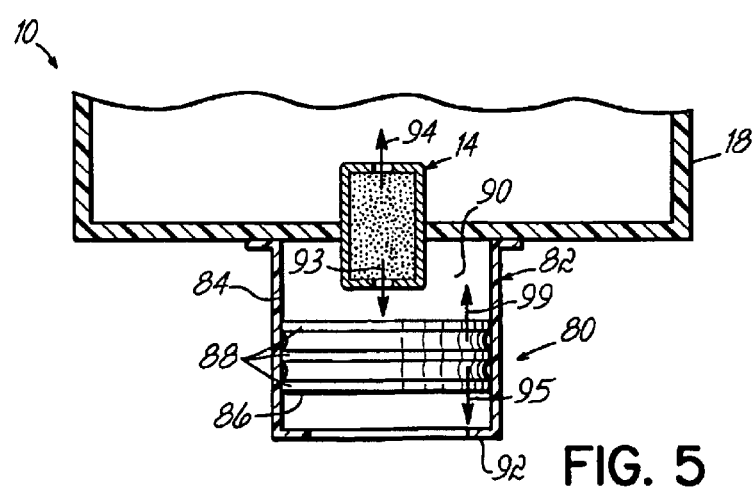
FIG. 5 is a top sectional view of another embodiment of a pressure equalization apparatus in accordance with principles of the invention coupled with a sealed system.

With reference to FIG. 5 in which like reference numerals refer to like features in FIGS. 1, 2A and 2B, a pressure equalization apparatus 80 in accordance with an embodiment of the invention includes a variable volume chamber 82 coupled in fluid communication with the enclosure 12 by desiccating vessel 14. The variable volume chamber 82 consists of a sleeve 84 extending outwardly from an airtight sealed attachment to the exterior of the enclosure 12 and a floating piston 86 positioned in sliding and sealed relation with sleeve 84. A radially-outermost surface of the floating piston 86 is provided with one or more sealing members 88 each disposed about an outer periphery of the floating piston 86. The sealing members 88 form an airtight seal between the floating piston 86 and the adjacent portion of the sleeve 84 so that a variable volume space 90 is isolated from the surrounding ambient atmosphere. An annular lip 92 is provided at the exit of the sleeve 84 and extends radially inward so that the floating piston 86 cannot be ejected from the sleeve 84 if the temperature of the gas inside the enclosure 12 exceeds the maximum estimated temperature. It is contemplated by the invention that the ejection of the floating piston 86 from sleeve 84 may be prevented by a different capturing mechanism. The air outlet 34 of the desiccant vessel 14 is sealingly coupled in fluid communication with the variable volume space 90 defined within the variable volume chamber 82.

In use, gas is transferred, as represented by arrow 93 in FIG. 5, from the fixed volume space 17 through the desiccating vessel 14 to the variable volume space 90 when the temperature of the gas is increasing. The floating piston 86 of the variable volume chamber 82 is displaced in an outward direction, as represented by arrow 95 in FIG. 5, by a transient outwardly-directed force that is proportional to the amount of transferred gas. The volume increase of the variable volume chamber 82 dissipates the additional pressure due to the inflowing gas. The outward movement of the floating piston 86 within sleeve 84 compensates for the increased pressure inside the fixed volume space 17 by increasing the volume of variable volume space 90 so that the net pressure within the enclosure 12 and the variable volume chamber 82 remains substantially equal to the air pressure of the ambient atmosphere.

When the temperature of the gas is decreasing, gas is transferred from the variable volume space 90 through the desiccating vessel 14 to the fixed volume space 17, as represented by arrow 94 in FIG. 5. As gas leaves the variable volume space 90, the floating piston 86 responds by moving in an inward direction relative to sleeve 84 toward the enclosure 12, as represented by arrow 99 in FIG. 5. If the temperature of the gas in fixed volume space 17 is constant, the pressure inside the spaces 17 and 90 is equilibrated with the ambient pressure. As a result, gas is not transferred between the spaces 17 and 90 and no net displacement force is applied which would cause movement of the floating piston 86 within sleeve 84.

According to the principles of the present invention, the pressure equalization apparatus 80 maintains the pressure of the gas inside the fixed volume space 17 substantially equal to the air pressure of the ambient environment surrounding the enclosure 12 and the variable volume chamber 82. As a result, the net force acting on the closure 20 is negligible, nil or otherwise balanced so that gas cannot leak outwardly past sealing element 24 as the temperature of the gas inside enclosure 12 increases nor can humid air leak inwardly past sealing element 24 as the temperature of the gas inside enclosure 12 decreases. In addition, the adsorbent 36 inside the desiccating vessel 14 reduces the dew point or relative humidity of the gas inside enclosure 12 by selectively removing water molecules or moisture from the gas intermittently or cyclically transferred between spaces 17 and 90.

Figure 6A:
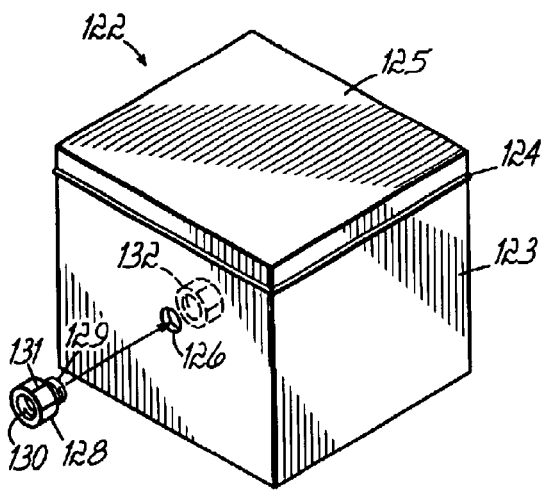
FIGS. 6A–6C are a series of perspective views illustrating a procedure for retrofitting a pressure equalization apparatus of the invention to an existing sealed system.
Figure 6B:
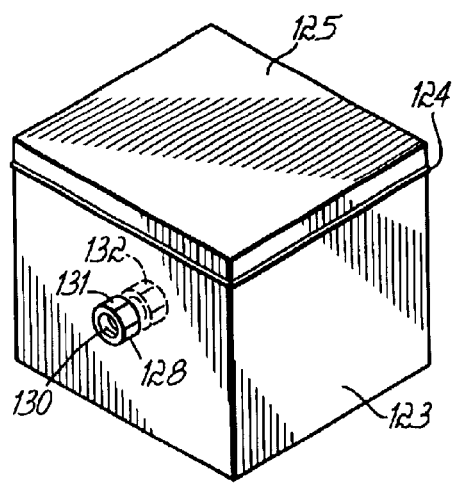
Figure 6C:
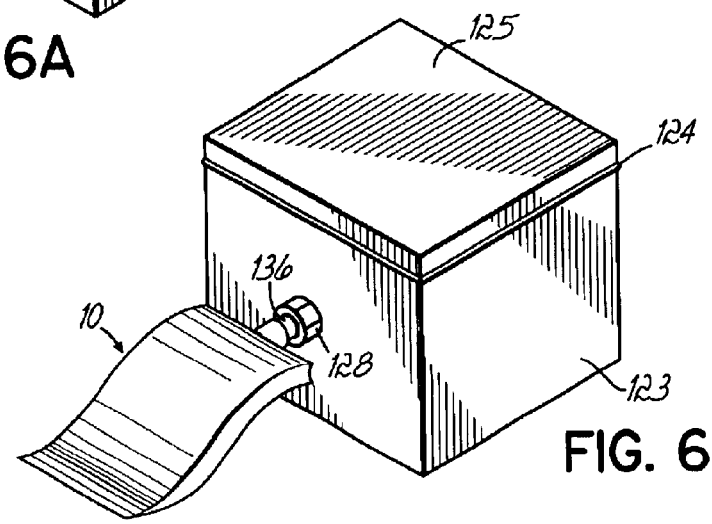

With reference to FIGS. 6A–6C, pressure equalization apparatus 10 may be retrofitted to an existing sealed system, such as enclosure 122, for providing pressure equalization to compensate for in the temperature of the ambient environment surrounding the enclosure 122. To that end and as shown in FIG. 6A, an opening 126 of a suitable diameter is provided in a wall of a base 123 the enclosure 122 by a conventional method, such as drilling or sawing. The enclosure 122 is reclosable and also includes a closure 125 and a sealing member 124 captured between the closure 125 and base 123. A fluid coupling, such as the illustrated bulkhead fitting 128, is provided. Next, and as shown in FIG. 6B, the bulkhead fitting 128 is installed in a fluid-tight manner into the opening 126. Conventional bulkhead fittings 128 includes a tubular sidewall 129 surrounding a fluid passageway 130, a flanged head 131 at one end of the tubular sidewall 129, and a lock nut 132 that is adapted to mate with corresponding threads provided on the exterior of the tubular sidewall 129. Typically, the interior of the tubular sidewall 129 includes a threaded portion with which a complementary threaded adapter coupling 136 (FIG. 6C) is engaged for purposes of providing a fluid coupling. Finally and as shown in FIG. 6C, pressure equalization apparatus 10 is mounted to the bulkhead fitting 128 with the fluid passageway 130 of the desiccating vessel 112 coupled in fluid communication with the fluid passageway 130 of the bulkhead fitting 128. Other techniques for providing fluid communication between the pressure equalization apparatus 10 and enclosure 122 are contemplated by the invention. In addition, the invention contemplates that any of the pressure equalization apparatus 40, 60, 80, 104 of the invention may be coupled in fluid communication with enclosure 122, rather than apparatus 10.

Exemplary enclosures 122 that may benefit from retrofitting with one of the pressure equalization apparatus 10, 40, 60, 80 of the present invention include any reclosable, sealed enclosure that is exposed to significant variations in temperature and that contains moisture-sensitive components. For example, sealed enclosures containing surveillance cameras and positioned in an outdoor environment would benefit from the retrofitted incorporation of a pressure equalization apparatus constructed according to the principles of the present invention.

Figure 7:
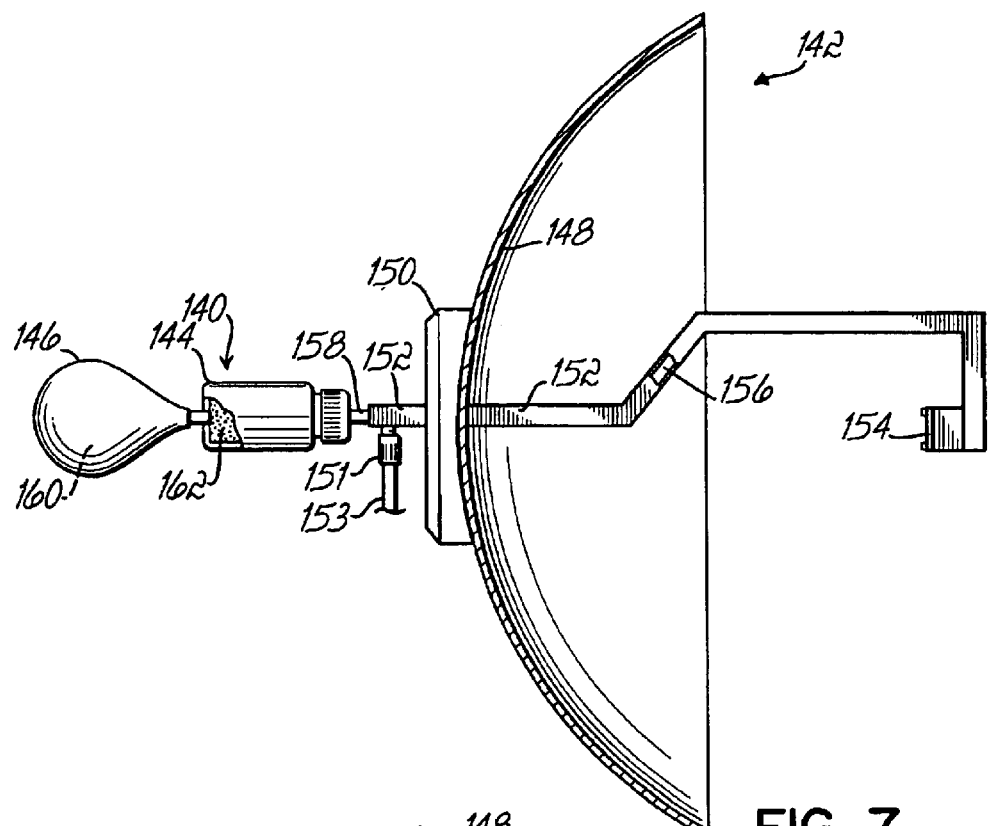
FIG. 7 is a diagrammatic perspective view of another embodiment of a pressure equalization apparatus in accordance with principles of the invention coupled with a waveguide of a waveguide-fed antenna.
Figure 8:
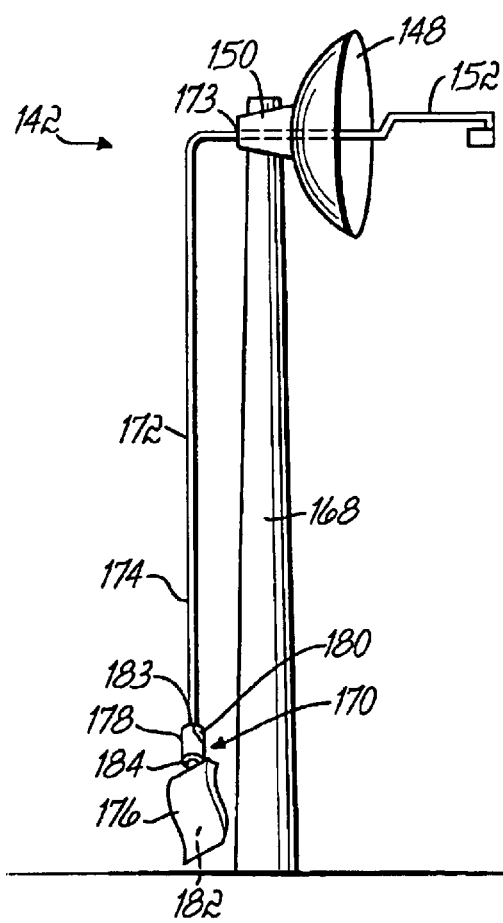
FIG. 8 is a diagrammatic perspective view of another embodiment of a pressure equalization apparatus in accordance with principles of the invention coupled with a waveguide of a waveguide-fed antenna positioned atop a tower.

With reference to FIG. 7 and according to the principles of the present invention, a pressure equalization apparatus 140 for a waveguide fed antenna 142 includes a desiccating vessel 144 and a variable volume chamber 146. The waveguide fed antenna 142 is provided with a reflector 148, an antenna mount 150 attached to reflector 148, and a waveguide 152. The antenna mount 150 is used to attach the antenna 142 to a support structure, such as support structure 168 (FIG. 8). Provided at one end of the waveguide 152 is an electrical connector 151 for electrically coupling the waveguide 152 with an RF-transmission line 153. The waveguide 152 extends through the center of the reflector 148 and has one end terminated by an RF-transmissive window 154 that faces toward the concave inner face of the reflector 148. A sealing element (not shown but similar to sealing element 206 in FIG. 9) is compressively captured between a periphery of the RF-transmissive window 154 and a surface of waveguide 152 to provide an airtight engagement. The pressure equalization apparatus 140 is disposed on the convex side of the reflector 148. The waveguide 152 encloses a fixed volume air space 156 filled with a gas, such as air or nitrogen.

The desiccating vessel 144 is mechanically attached by any suitable fluid coupling 158 with the waveguide 152. The desiccating vessel 144 is further coupled in fluid communication with a variable volume space 160 enclosed by the variable volume chamber 146. The desiccating vessel 144 is filled with a quantity of an adsorbent 162 operative to remove moisture from the gas transferred between the fixed volume space 156 and the variable volume space 160 as the temperature of the gas inside space 156 varies. As the temperature of the gas inside the fixed volume space 156 increases, gas is transferred from space 156 through the desiccating vessel 144 and into the variable volume space 160. The volume of the variable volume space 160 increases commensurately with the volume of transferred gas so as to maintain the pressure of the fluidically-coupled sealed system consisting of spaces 156 and 160 constant. As the temperature of the gas inside the fixed volume space 156 decreases, gas is transferred from the variable volume space 160 through the desiccating vessel 144 and into the fixed volume space 156. The volume of the variable volume space 160 decreases commensurately with the volume of transferred gas so as to maintain the pressure of the fluidically-coupled sealed system consisting of spaces 156 and 160 constant.

According to the principles of the present invention, the pressure equalization apparatus 140 maintains the pressure of the gas inside the fixed volume space 156 substantially equal to the air pressure of the ambient environment surrounding the antenna 142. As a result, the net force acting on the RF-transmissive window 154 is negligible, nil or otherwise balanced so that the risk of damage to, or failure of, window 154 is significantly reduced. In addition, gas cannot leak outwardly past the sealing element 155 as the temperature of the gas inside the fixed volume space 156 increases nor can humid air leak inwardly past sealing element 155 as the temperature of the gas inside the fixed volume space 156 decreases. In addition, the adsorbent 162 inside the desiccating vessel 144 reduces the dew point or relative humidity of the gas inside waveguide 152 by selectively removing water molecules or moisture from the gas intermittently or cyclically transferred between spaces 156 and 160. Typically, a dew point of about −40° C. to about −45° C. is desired for hermetically sealed enclosed spaces, such as fixed volume space 156, used in communications systems.

With reference to FIG. 8 in which like reference numerals refer to like features in FIG. 7, antenna 142 is deployed atop a support structure or tower 168 and is provided with a remotely-positioned pressure equalization apparatus 170. The antenna 142 is supported by multiple struts (not shown) connecting antenna mount 150 with a portion of the tower 168. The tower 168 extends upwardly from ground level and locates the antenna 142 at an elevation suitable for use in communications systems. A conduit 172 provides a fluid pathway between the fixed volume space 156 (FIG. 7) inside the waveguide 152 and the pressure equalization apparatus 170. Conduit 172 may be formed from any suitable conventional material, including polyvinylchloride and copper tubing. One end 173 of the conduit 172 is coupled in fluid communication with the fixed volume space 156 inside the waveguide 152 and an opposite end 174 of the conduit 172 is coupled in fluid communication with the pressure equalization apparatus 170.

The pressure equalization apparatus 170 includes a variable volume chamber 176 and a desiccating vessel 178 located at ground level or at a height above ground level that affords convenient access. Such access is useful, for example, to replace or regenerate an adsorbent 180 inside the desiccating vessel 178. The desiccating vessel 178 is disposed in the flow path between the fixed volume space 156 inside the waveguide 152 and a variable volume space 182 within the variable volume chamber 176. The desiccating vessel 178 has an air inlet 183 coupled in fluid communication with end 174 of the conduit 172 and an air outlet 184 coupled in fluid communication with the variable volume chamber 176. The waveguide 152, the conduit 172, the variable volume chamber 176, and the desiccating vessel 178 form a hermetically-sealed air space in which conduit 172 and desiccating vessel 178 provide a flow path between the fixed volume space 156 and the variable volume space 182.

Figure 9:
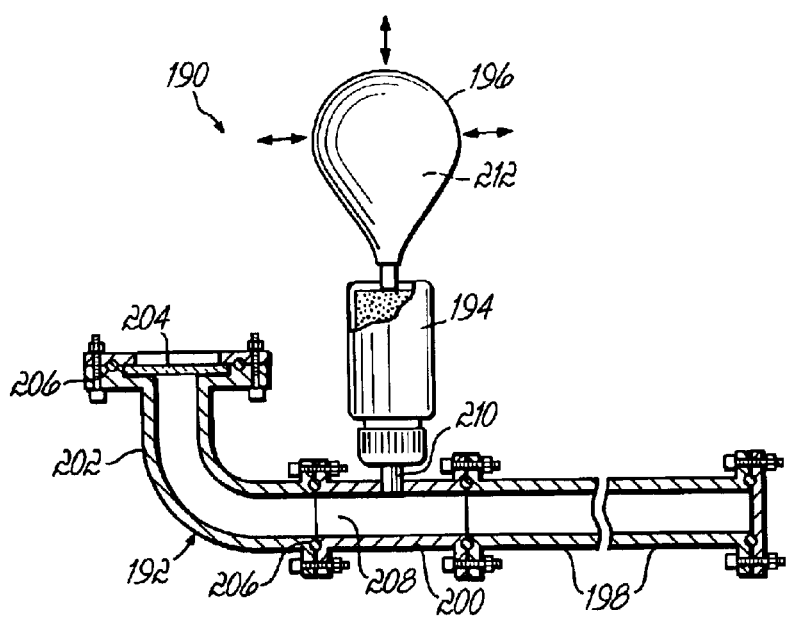
FIG. 9 is a diagrammatic perspective view of another embodiment of a pressure equalization apparatus in accordance with principles of the invention coupled with multiple sections of a waveguide assembly.

With reference to FIG. 9, a pressure equalization apparatus 190 for a waveguide or transmission line 192 includes a desiccating vessel 194 and a variable volume chamber 196. The transmission line 192 includes multiple waveguide sections 198, a connecting waveguide section 200, and a curved waveguide section 202 terminated by an RF-transmissive window 204. Sealing members 206 are provided at the junctions of the various waveguide sections 198, 200, 202 and are adapted to provide a hermetic seal for a fixed volume space 208 enclosed inside the transmission line 192. The desiccating vessel 194 is mounted to the connecting waveguide section 200 and is coupled in fluid communication with the fixed volume space 208 by a fluid coupling 210. The desiccating vessel 194 is further coupled in fluid communication with a variable volume space 212 enclosed within the variable volume chamber 196. It is appreciated that the fixed volume space 208, the variable volume space 212 and the air space inside the desiccating vessel 194 comprise a closed system hermetically sealed relative to the surrounding ambient environment.

In use, pressure equalization apparatus 170 (FIG. 8) and pressure equalization apparatus 190 (FIG. 9) operate similar to pressure equalization apparatus 140 (FIG. 7) and pressure equalization apparatus 10 (FIGS. 1, 2A and 2B) for regulating the pressure within a sealed system. It is further appreciated that the principles embodied in any of the pressure equalization apparatus 40 (FIG. 3), 60 (FIG. 4), 80 (FIG. 5) and may be adapted for use with pressure equalization apparatus 140 (FIG. 7), 170 (FIG. 8) and 190 (FIG. 9) without departing from the spirit and scope of the present invention. It is still further appreciated that any of the pressure equalization apparatus 140 (FIG. 7), 170 (FIG. 8) and 190 (FIG. 9) may be retrofitted to an existing, hermetically-sealed enclosure used in communications applications by a retrofitting operation similar to that depicted in FIGS. 6A–C.

While the present invention has been illustrated by a description of various preferred embodiments and while these embodiments have been described in considerable detail in order to describe the best mode of practicing the invention, it is not the intention of the applicants to restrict or in any way limit the scope of the appended claims to such detail. Additional advantages and modifications within the spirit and scope of the invention will readily appear to those skilled in the art. The invention itself should only be defined by the appended claims, wherein we claim:

What is claimed is:

1. An apparatus having closed pressure equalization comprising:
   a waveguide-fed antenna including a waveguide occupied by a gas;
   a variable volume chamber having a flow path in fluid communication with said waveguide, said variable volume chamber operable for changing its volume in response to a flow of the gas therein induced by pressure fluctuations inside said waveguide; and
   an adsorbent disposed in said flow path and operative to dehumidify the gas flowing in said flow path between said waveguide and said variable volume chamber.

2. The apparatus of claim 1 wherein said antenna and said variable volume chamber are mounted on a tower, said variable volume chamber being configured to be positioned proximate to said antenna.

3. The apparatus of claim 1 wherein said variable volume chamber is an expansible structure selected from the group consisting of a bladder, a diaphragm, a piston, and a bellows.

4. The apparatus of claim 1 wherein said adsorbent is a material selected from the group consisting of activated alumina-based adsorbents, anhydrous calcium sulfate, silica gels, zeolites, and non-zeolite molecular sieves.

5. The apparatus of claim 1 wherein said flow path includes a conduit coupling said variable volume chamber in fluid communication with the waveguide.

6. The apparatus of claim 1 further comprising a protective cover surrounding said variable volume chamber.

7. The apparatus of claim 6 wherein said protective cover is vented to atmospheric pressure.

8. The apparatus of claim 1 wherein said antenna is mounted on a tower, and said variable volume chamber configured to be positioned substantially at ground level, said variable volume chamber coupled in fluid communication with said waveguide by a conduit.

9. A method of equalizing the pressure in side a sealed system occupied by a gas susceptible to pressure changes, comprising:
   coupling an inlet of a housing enclosing an adsorbent in fluid communication with the sealed system and an outlet of the housing in fluid communication with a variable volume chamber, the housing defining a portion of a flow path between the system and the chamber;
   exchanging gas between the sealed system and the variable volume chamber as the pressure inside the sealed system changes;
   allowing the volume of the variable volume chamber to change in response to the exchange of gas to maintain the pressure of the gas in the variable volume chamber and the sealed system substantially constant;
   dehumidifying the gas exchanged between the sealed system and the variable volume chamber by flow in the portion of the flow path through the adsorbent;
   locating the sealed system atop a support structure extending upwardly from ground level; and
   locating the variable volume chamber substantially at around level.

10. The method of claim 9 wherein allowing the volume to change further comprises expanding and contracting a resilient bladder to change the volume of the variable volume chamber in response to the exchange of gas.

11. The method of claim 9 wherein allowing the volume to change further comprises distending a resilient diaphragm to change the volume of the variable volume chamber in response to the exchange of gas.

12. The method of claim 9 wherein allowing the volume to change further comprises lengthening and shortening a bellows to change the volume of the variable volume chamber in response to the exchange of gas.

13. The method of claim 9 wherein allowing the volume to change further comprises moving a floating piston within a confining sleeve to change the volume of the variable volume chamber in response to the exchange of gas.

14. The method of claim 9 wherein exchanging gas between the sealed system and the variable volume chamber includes placing the sealed system in an ambient environment susceptible to temperature variations.

15. A method of retrofitting a pressure equalization apparatus to a sealed system occupied with gas, comprising:
   providing a variable volume chamber operable for changing its volume in response to a flow of gas therein, a housing defining a flow path into the variable volume chamber, and an adsorbent disposed in the housing, the adsorbent being operative to dehumidify gas flowing in the flow path;
   providing an opening into the sealed space, the sealed system being selected from the group consisting of a waveguide and a waveguide feed; and
   mounting the variable volume chamber in fluid communication with the opening of the sealed space so that gas can be exchanged through the housing between the variable volume chamber and the space.

16. The retrofitting method of claim 15 wherein mounting the variable volume chamber further comprises introducing a fluid coupling into the opening for coupling the variable volume chamber in fluid communication the sealed space.

17. A closed pressure equalization apparatus, said apparatus comprising:
   a waveguide occupied by a gas;
   a variable volume chamber coupled in fluid communication with said waveguide, said variable volume chamber operable for changing its volume in response to a flow of the gas therein induced by pressure fluctuations inside said waveguide; and
   an adsorbent disposed in a flow path between said waveguide and said variable volume chamber and operative to dehumidify the gas flowing in said flow path.

18. The apparatus of claim 17 wherein said variable volume chamber is an expansible structure selected from the group consisting of a bladder, a diaphragm, a piston, and a bellows.

19. The apparatus of claim 17 wherein said adsorbent is a material selected from the group consisting of activated alumina-based adsorbents, anhydrous calcium sulfate, silica gels, zeolites, and non-zeolite molecular sieves.

20. The apparatus of claim 17 wherein said flow path includes a conduit coupling said variable volume chamber in fluid communication with said waveguide.

21. The apparatus of claim 17 further comprising a protective cover surrounding said variable volume chamber.

22. The apparatus of claim 21 wherein said protective cover is vented to atmospheric pressure.

23. A closed pressure equalization apparatus configured for use with a sealed system occupied by a gas, said apparatus comprising:
   a variable volume chamber configured to be coupled in fluid communication with the sealed system, said chamber including a sleeve and a floating piston disposed in a sliding and sealed relationship with said sleeve for defining a variable volume, said floating piston having one surface exposed to ambient air at atmospheric pressure and a second surface exposed to gas in the sealed system, and said floating piston being movable within said sleeve in response to a flow of gas therein induced by pressure fluctuations inside the sealed system; and an adsorbent disposed in a flow path between the sealed system and said chamber and operative to dehumidify the gas flowing in said flow path.

24. The apparatus of claim 23 wherein said adsorbent is a material selected from the group consisting of activated alumina-based adsorbents, anhydrous calcium sulfate, silica gels, zeolites, and non-zeolite molecular sieves.

25. The apparatus of claim 23 wherein said flow path includes a conduit coupling said variable volume chamber in fluid communication with the sealed space.

26. The apparatus of claim 23 further comprising a protective cover surrounding said variable volume chamber.

27. The apparatus of claim 26 wherein said protective cover is vented to atmospheric pressure.

28. A pressure equalization system comprising:

a waveguide;

a variable chamber having a variable volume and a flow path coupled in fluid communication with said waveguide, said variable chamber operable for varying its volume in response to a flow of gas into said chamber from said waveguide; and a container of material coupled with said variable chamber to treat gas flowing between said waveguide and said variable chamber.

29. The apparatus of claim 28 wherein said variable volume chamber is an expansible structure selected from the group consisting of a bladder, a diaphragm, a piston, and a bellows.

30. The apparatus of claim 28 wherein said material is a selected from the group consisting of activated alumina-based adsorbents, anhydrous calcium sulfate, silica gels, zeolites, and non-zeolite molecular sieves.

31. The apparatus of claim 28 wherein said flow path includes a conduit coupling said variable volume chamber in fluid communication with said waveguide.

32. The apparatus of claim 28 further comprising a protective cover surrounding said variable volume chamber.

33. The apparatus of claim 32 wherein said protective cover is vented to atmospheric pressure.

34. A pressure equalization system comprising:

a waveguide feed for an antenna;

a variable chamber coupled in fluid communication with the waveguide feed, said variable chamber operable for varying its volume in response to a flow of gas into the chamber from the waveguide feed; and a container of material coupled with the variable chamber to treat gas flowing between the waveguide feed and said variable chamber.

35. The apparatus of claim 34 wherein said variable volume chamber is an expansible structure selected from the group consisting of a bladder, a diaphragm, a piston, and a bellows.

36. The apparatus of claim 34 wherein said adsorbent is a material selected from the group consisting of activated alumina-based adsorbents, anhydrous calcium sulfate, silica gels, zeolites, and non-zeolite molecular sieves.

37. The apparatus of claim 34 wherein said flow path includes a conduit coupling said variable volume chamber in fluid communication with said waveguide feed.

38. The apparatus of claim 34 further comprising a protective cover surrounding said variable volume chamber.

39. The apparatus of claim 38 wherein said protective cover is vented to atmospheric pressure.

40. A method of equalizing the pressure inside a sealed system occupied by a gas susceptible to pressure changes, comprising:

coupling the sealed system in fluid communication with a variable volume chamber, the sealed system being selected from the group consisting of a waveguide and a waveguide feed;

exchanging gas between the sealed system and the variable volume chamber as the pressure inside the sealed system changes;

allowing the volume of the variable volume chamber to change in response to the exchange of gas to maintain the pressure of the gas in the variable volume chamber and the sealed system substantially constant; and dehumidifying the gas exchanged between the sealed system and the variable volume chamber by flow in the portion of the flow path through the adsorbent.

41. The method of claim 40 wherein allowing the volume to change further comprises expanding and contracting a resilient bladder to change the volume of the variable volume chamber in response to the exchange of gas.

42. The method of claim 40 wherein allowing the volume to change further comprises distending a resilient diaphragm to change the volume of the variable volume chamber in response to the exchange of gas.

43. The method of claim 40 wherein allowing the volume to change further comprises lengthening and shortening a bellows to change the volume of the variable volume chamber in response to the exchange of gas.

44. The method of claim 40 wherein allowing the volume to change further comprises moving a floating piston within a confining sleeve to change the volume of the variable volume chamber in response to the exchange of gas.

45. The method of claim 40 wherein exchanging gas between the sealed system and the variable volume chamber includes placing the sealed system in an ambient environment susceptible to temperature variations.

* * * * *